US012652984B2

(12) United States Patent
Li et al.

(10) Patent No.: US 12,652,984 B2
(45) Date of Patent: Jun. 9, 2026

(54) CONTROL OF ENVIRONMENT WITHIN PROCESSING MODULES

(71) Applicant: Taiwan Semiconductor Manufacturing Co., Ltd., Hsinchu (TW)

(72) Inventors: Jhih-Yu Li, Hsinchu (TW); Nai-Han Cheng, Hsinchu (TW); Chien-Hung Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 567 days.

(21) Appl. No.: 18/168,265

(22) Filed: Feb. 13, 2023

(65) Prior Publication Data

US 2024/0153787 A1    May 9, 2024

Related U.S. Application Data

(60) Provisional application No. 63/382,611, filed on Nov. 7, 2022.

(51) Int. Cl.
| | |
|---|---|
| *H01L 21/67* | (2006.01) |
| *C23C 14/48* | (2006.01) |
| *C23C 14/54* | (2006.01) |
| *H10P 72/00* | (2026.01) |
| *H10W 20/00* | (2026.01) |

(52) U.S. Cl.
CPC .......... *H10P 72/0402* (2026.01); *C23C 14/48* (2013.01); *C23C 14/54* (2013.01); *H10P 72/06* (2026.01); *H10P 72/0454* (2026.01); *H10P 72/0471* (2026.01); *H10W 20/056* (2026.01)

(58) Field of Classification Search
CPC .......... C23C 14/48; C23C 14/54; F24F 3/167; H01L 21/67017; H01L 21/67167; H01L 21/67213; H01L 21/67242; H01L 21/76883
See application file for complete search history.

(56) References Cited

U.S. PATENT DOCUMENTS

| | | | | |
|---|---|---|---|---|
| 2019/0267258 A1* | 8/2019 | Rice | .................. | H01L 21/67017 |
| 2022/0285192 A1* | 9/2022 | Hsu | .................. | H01L 21/67766 |
| 2023/0102035 A1* | 3/2023 | Saito | .................. | H01L 21/67781 |
| | | | | 438/800 |
| 2023/0197472 A1* | 6/2023 | Kraus | .................. | C23C 16/4408 |
| | | | | 34/487 |
| 2023/0207359 A1* | 6/2023 | Wu | .................. | H01L 21/67766 |
| | | | | 206/710 |
| 2025/0093890 A1* | 3/2025 | Senn | .................. | H01L 21/67253 |

FOREIGN PATENT DOCUMENTS

| | | |
|---|---|---|
| CN | 114765127 A | 7/2022 |
| TW | I698945 B | 7/2020 |
| TW | 202129804 A | 8/2021 |

* cited by examiner

*Primary Examiner* — Jaehwan Oh
(74) *Attorney, Agent, or Firm* — Seed IP Law Group

(57) ABSTRACT

Methods and apparatuses for adjusting and controlling conditions within the environment of a workpiece handling module include sensors for detecting humidity and concentration of harmful gasses. Signals generated by these sensors are utilized to generate signals that control the flow of air into the environment and/or the flow of air and gases out of the environment. By controlling the humidity, negative impacts on processes carried out in the environment are avoided. By controlling the gas concentration, exposure of workers to harmful gases is avoided.

20 Claims, 16 Drawing Sheets

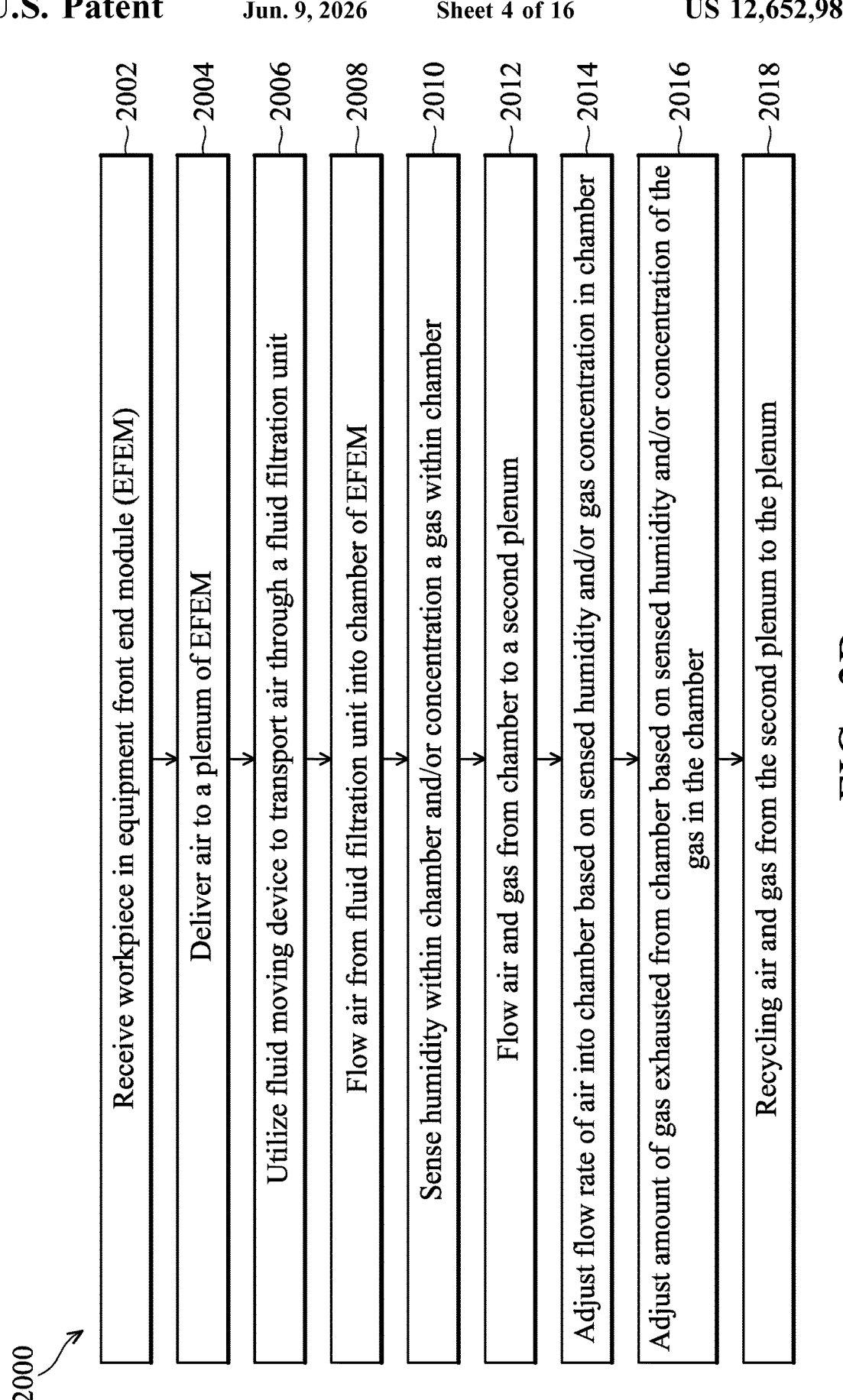

Receive workpiece in equipment front end module (EFEM) — 2002

Deliver air to a plenum of EFEM — 2004

Utilize fluid moving device to transport air through a fluid filtration unit — 2006

Flow air from fluid filtration unit into chamber of EFEM — 2008

Sense humidity within chamber and/or concentration a gas within chamber — 2010

Flow air and gas from chamber to a second plenum — 2012

Adjust flow rate of air into chamber based on sensed humidity and/or gas concentration in chamber — 2014

Adjust amount of gas exhausted from chamber based on sensed humidity and/or concentration of the gas in the chamber — 2016

Recycling air and gas from the second plenum to the plenum — 2018

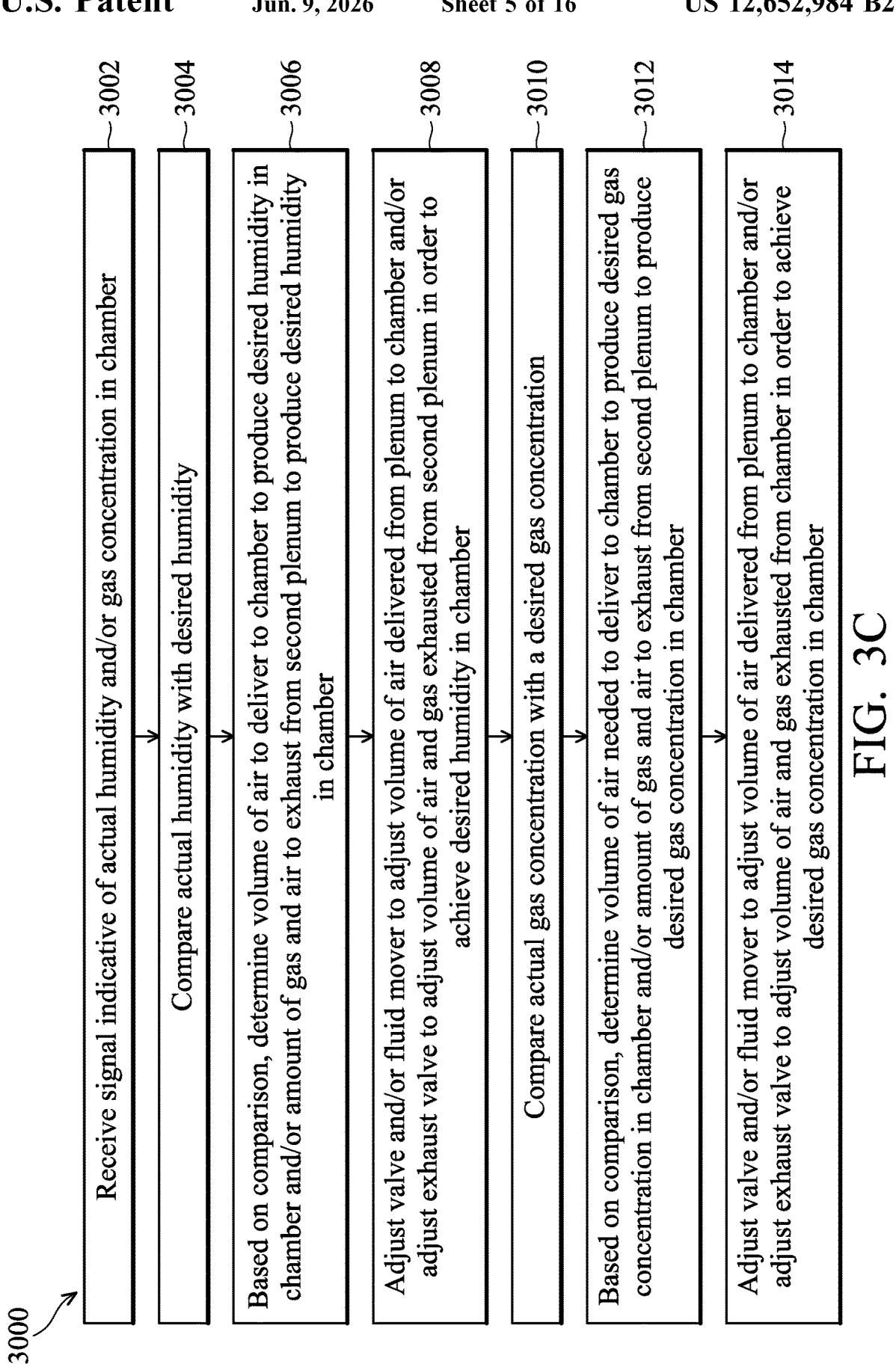

3000

3002 — Receive signal indicative of actual humidity and/or gas concentration in chamber 3004 — Compare actual humidity with desired humidity 3006 — Based on comparison, determine volume of air to deliver to chamber to produce desired humidity in chamber and/or amount of gas and air to exhaust from second plenum to produce desired humidity in chamber 3008 — Adjust valve and/or fluid mover to adjust volume of air delivered from plenum to chamber and/or adjust exhaust valve to adjust volume of air and gas exhausted from second plenum in order to achieve desired humidity in chamber 3010 — Compare actual gas concentration with a desired gas concentration 3012 — Based on comparison, determine volume of air needed to deliver to chamber to produce desired gas concentration in chamber and/or amount of gas and air to exhaust from second plenum to produce desired gas concentration in chamber 3014 — Adjust valve and/or fluid mover to adjust volume of air delivered from plenum to chamber and/or adjust exhaust valve to adjust volume of air and gas exhausted from chamber in order to achieve desired gas concentration in chamber

CONTROL OF ENVIRONMENT WITHIN PROCESSING MODULES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a flow chart of a portion of a method carried out in accordance with embodiments of the present disclosure.

FIG. 3C is a flow chart of a portion of a method carried out in accordance with embodiments of the present disclosure.

DETAILED DESCRIPTION

Figure 1:
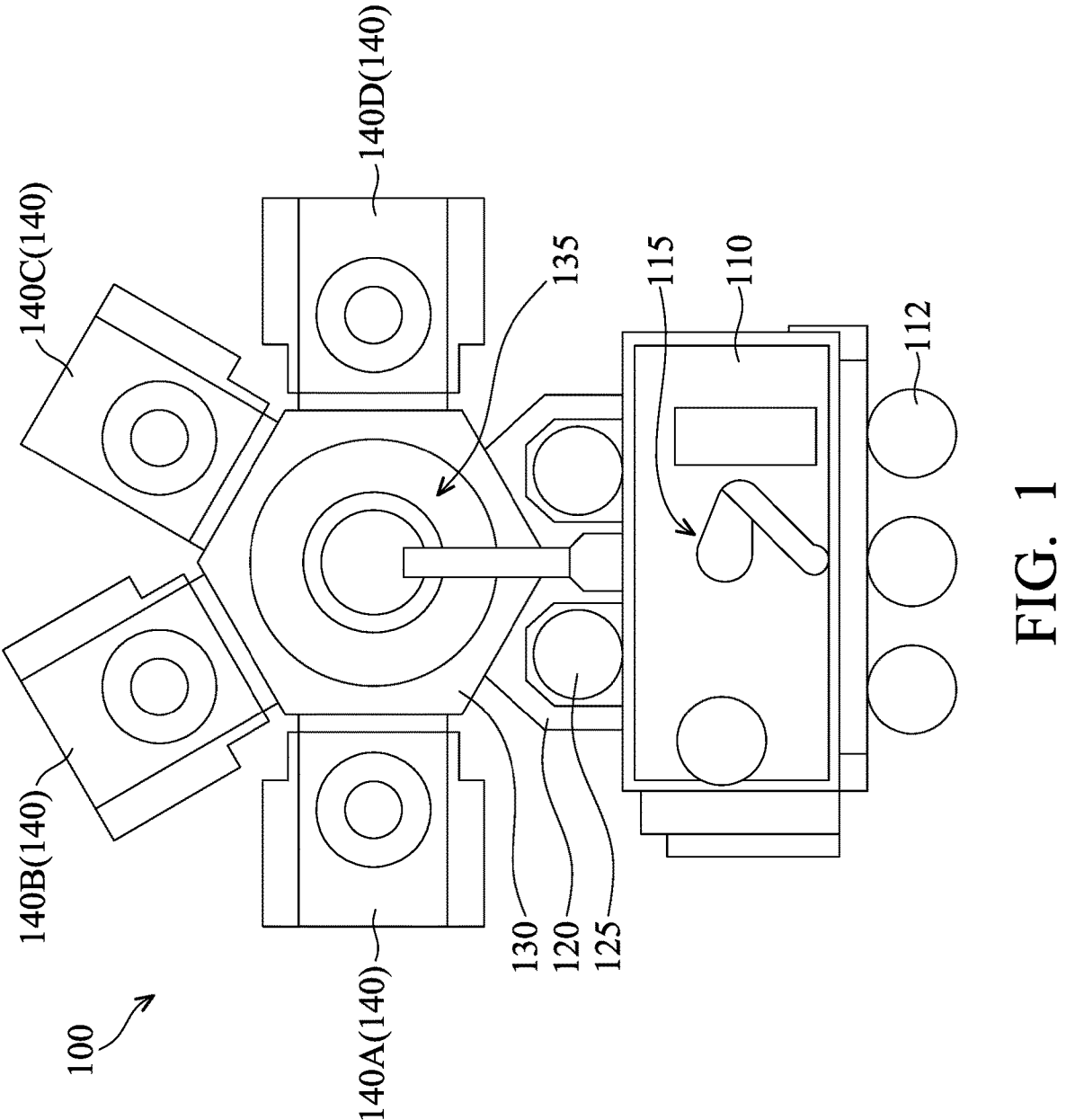
FIG. 1 is a top view of a system for processing a semiconductor workpiece in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Vertical direction" and "horizontal direction" are to be understood as indicating relative directions. Thus, the horizontal direction is to be understood as substantially perpendicular to the vertical direction and vice versa. Nevertheless, it is within the scope of the present disclosure that the described embodiments and aspects may be rotated in its entirety such that the dimension referred to as the vertical direction is oriented horizontally and, at the same time, the dimension referred to as the horizontal direction is oriented vertically.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With continuing reduction in feature size, humidity within chambers through which semiconductor workpieces pass can affect the quality of processes carried out on the workpieces in those chambers. For example, certain implantation processes, e.g., implantation of ions in gaps between dielectric and conductive features, are utilized to fill in those gaps between the dielectric and conductive features. Such implantation process can be negatively affected by too high a humidity in the chamber where the implantation occurs. For example, the excess moisture can within the gaps can negatively affect filling of those gaps with implanted ions. For example, it has been observed that when a Ge implantation is utilized to fill gaps between a dielectric and a conductive feature and is carried out in an environment with excessive humidity, the implantation is not successful in filling the gaps. When the gaps are not filled, the provide pathways for unwanted materials to access features and in some cases react with those features in a way that results in loss of the material of those features. In addition, there is an ongoing concern for protecting those who work in environments into which gases from semiconductor workpiece handling and/or processing chambers are exhausted.

Figure 2:
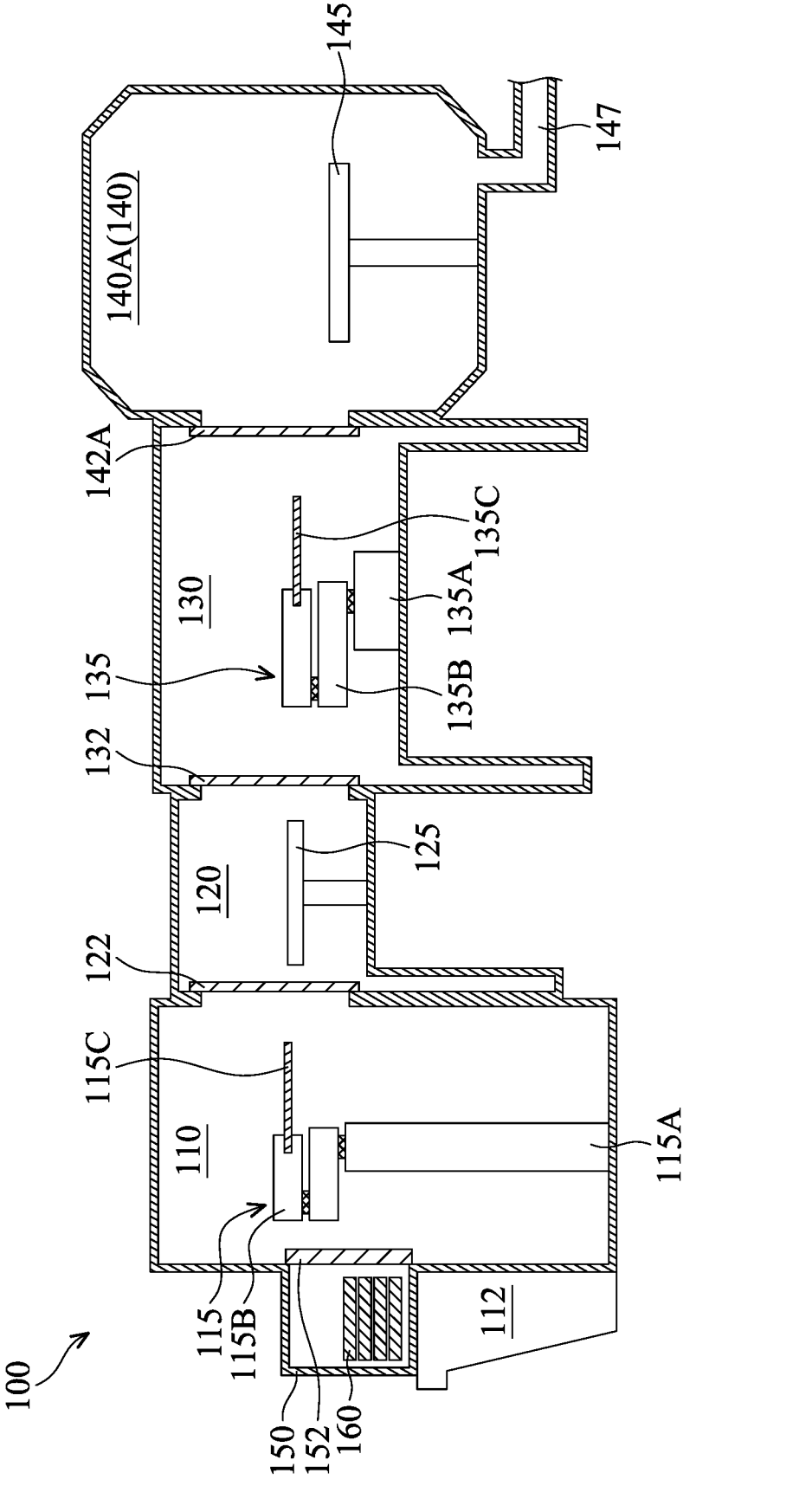
FIG. 2 is a cross-sectional view of a system for processing a semiconductor workpiece in accordance with some embodiments of the present disclosure.
Figure 4:
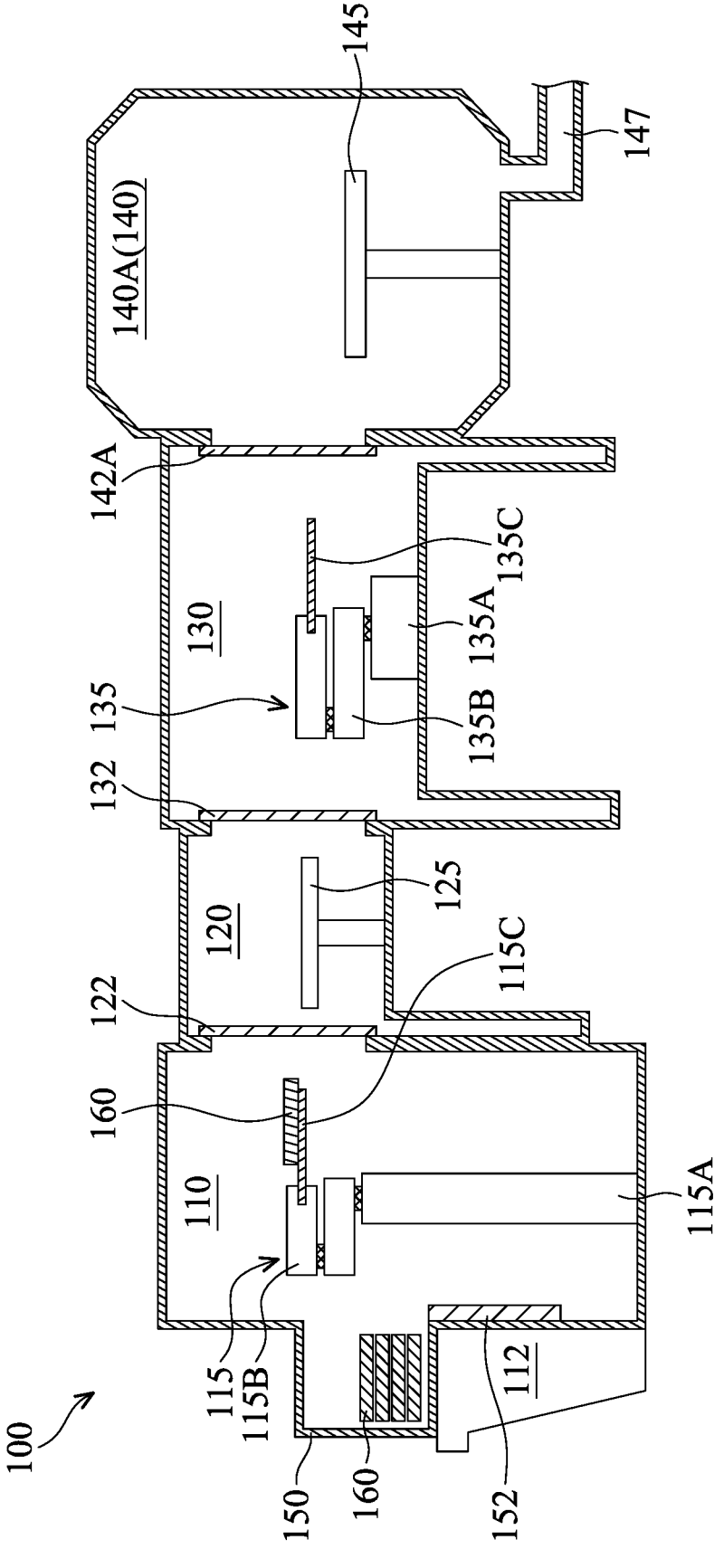
FIG. 4 through 10B illustrate a method in accordance with embodiments of the present disclosure.

Reference is made to FIGS. 1 and 2. FIG. 1 is a top plan view of a system, e.g., a system 100, and FIG. 2 shows a schematic cross-sectional side view of the same. In some embodiments, the system 100 includes a central transfer chamber 130 with a central transfer robot arm 135, one or more process chambers 140, one or more load lock chambers 120, an equipment front end module (EFEM) 110 with a load lock transfer robot arm 115, and one or more load ports 112. The central transfer chamber 130 connects to the process chambers 140 and to the load lock chambers 120. This configuration allows the central transfer robot arm 130 to transport a workpiece, e.g., workpiece or substrate (e.g., the workpiece 160 as shown in FIG. 4) between the process chambers 140 and the load lock chambers 120. In some embodiments, the process chambers 140 include process chambers 140A-140D, the number of the process chambers 140 are merely used to explain, less or more process chambers 140 may also be employed in some other embodiments.

In some embodiments, the workpiece 160 may be a substrate. The workpiece 160 may include one or more semiconductor, conductor, and/or insulator layers. The semiconductor layers may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or gradient such as a substrate in which the ratio of Si and Ge vary across locations. In some embodiments, the workpiece 160 may include layered semiconductors. Examples include the layering of a semiconductor layer on an insulator such as that used to produce a silicon-on-insulator ("SOI") substrate, a silicon-on-sapphire substrate, or a silicon-germanium-on-insulator substrate, or the layering of a semiconductor on glass to produce a thin film transistor ("TFT").

The area of the system 100 defined by the central transfer chamber 130 and the process chambers 140 is sealed. Atmospheric controls, including filtering, provide an environment with extremely low levels of particulates and airborne molecular contamination ("AMC"), both of which may damage the workpiece 160. By creating a microenvironment within the system 100, the process chambers 140 can be operated in a cleaner environment than the surrounding facilities. This allows tighter control of contaminates during workpiece processing at reduced cost.

The load lock chamber 120 preserves the atmosphere within the central transfer chamber 130 and process chambers 140 by separating them from the equipment front end module (EFEM) 110. The load lock chamber 120 includes two doors, a central transfer chamber door 132 and a load lock door 122. The workpiece 160 is inserted into the load lock chamber 120 and both doors are sealed. The load lock chamber 120 is capable of creating an atmosphere compatible with the EFEM 110 or the central transfer chamber 130 depending on where the loaded workpiece 160 is scheduled to be next. This may involve altering the gas content of the load lock chamber 120 by such mechanisms as adding purified gases or creating a vacuum, along with other suitable means for adjusting the load lock chamber atmosphere. When the correct atmosphere has been reached, the corresponding door may be opened, and the workpiece 160 can be accessed.

The EFEM 110 provides a closed environment to transfer the workpiece 160 into and out of the system 100. The EFEM 110 contains the load lock robot arm 115 which performs the physical transfer of the workpiece 160. The workpiece 160 is loaded through the load port 112. In some embodiments, the workpiece 160 arrives at the load port 112 contained in a transport carrier 150 such as a front-opening unified pod ("FOUP"), a front-opening shipping box ("FOSB"), a standard mechanical interface ("SMIF") pod, and/or other suitable container. The transport carrier 150 is a magazine for holding one or more workpieces 160 and for transporting workpieces 160 between manufacturing tools. In some embodiments, the transport carrier 150 may have features such as coupling locations and electronic tags to facilitate use with an automated materials handling system (AMHS). The transport carrier 150 is sealed in order to provide a microenvironment for the workpiece 160 contained within and to protect the workpiece 160 and the system 100 against contamination. To prevent loss of the controlled atmosphere, the transport carrier 150 may have a door 152 such that the transport carrier 150 remains sealed until it is docked with the load port 112.

Figure 3A:
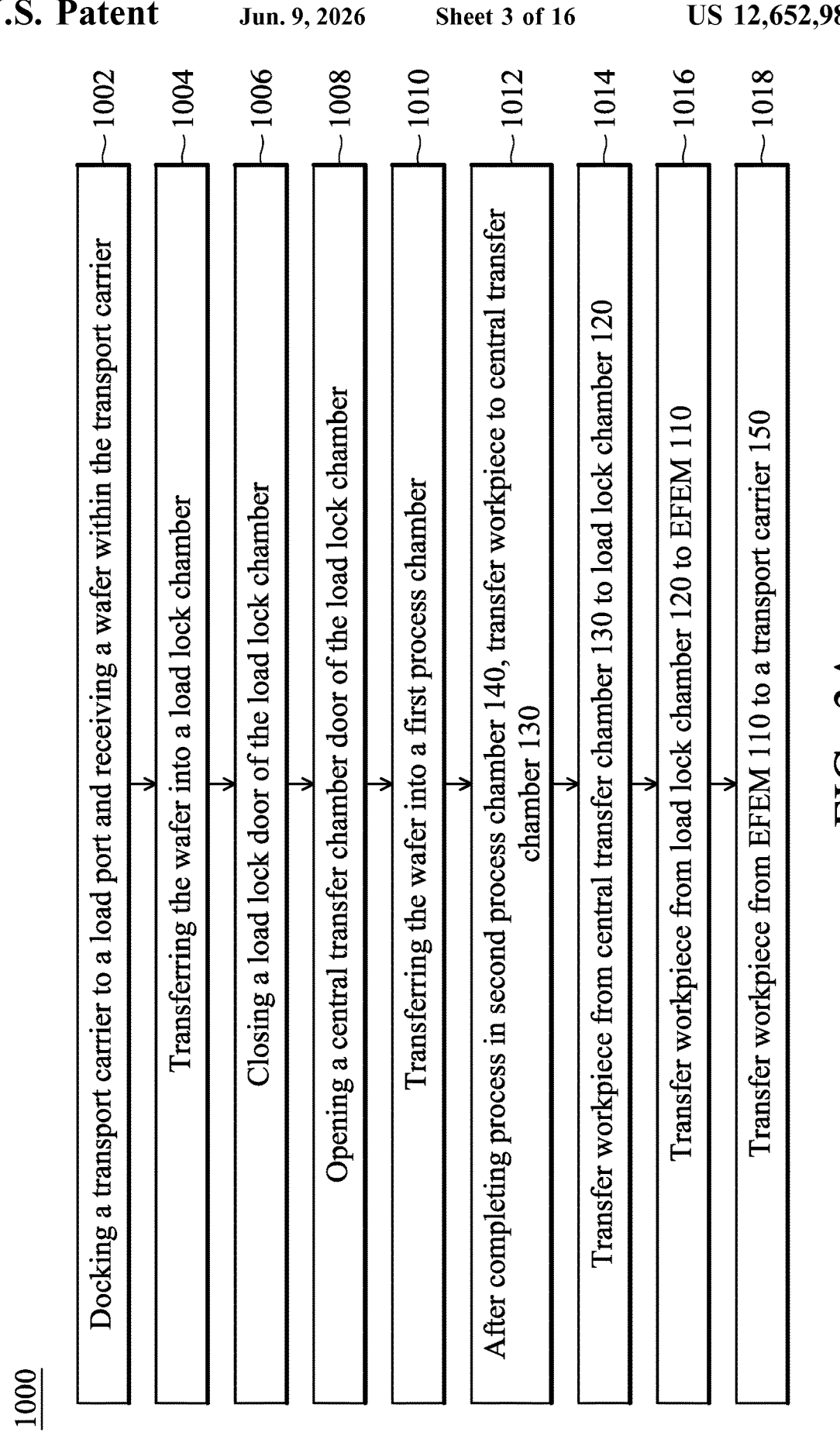
FIG. 3A is a flow chart of a portion of a method carried out in accordance with embodiments of the present disclosure.

FIG. 3A is a method for using the system in accordance with some embodiments of the present disclosure.

Reference is made to FIGS. 1, 3A and 4. The method 1000 begins at operation 1002 by docking a transport carrier to a load port and receiving a workpiece within the transport carrier. In FIG. 4, at the beginning, the transport carrier 150 is docked to the load port 112. Then, the door 152 of the transport carrier 150 is opened, and the load lock transfer robot arm 115 within the EFEM 110 clamp the workpiece 160 disposed in the transport carrier 150, and then moves the workpiece 160 into the EFEM 110.

In some embodiments, the load lock transfer robot arm 115 includes a support 115A. An armset 115B is mounted on the support 115A. In some other embodiments, the armset 115B includes suitable number of arms, such as two or more. The arms of the armset 115B are rotatably connected to each other. At the far end of the armset 115B, an end effector 115C is rotatably connected thereto. The load lock transfer robot arm 115 can position the end effector 115C in a desired position within a circle around the support 115A, having a radius that is substantially determined by the length of the armset 115B. As is apparent, also other kinds of robot arm may be used. The end effector 115C is arranged to clamp an object, such as the workpiece 160 shown in FIG. 4. For example, the end effector 115C clamps the workpiece 160 in the transport carrier 150, and then moves the workpiece 160 into the EFEM 110.

Figure 5:
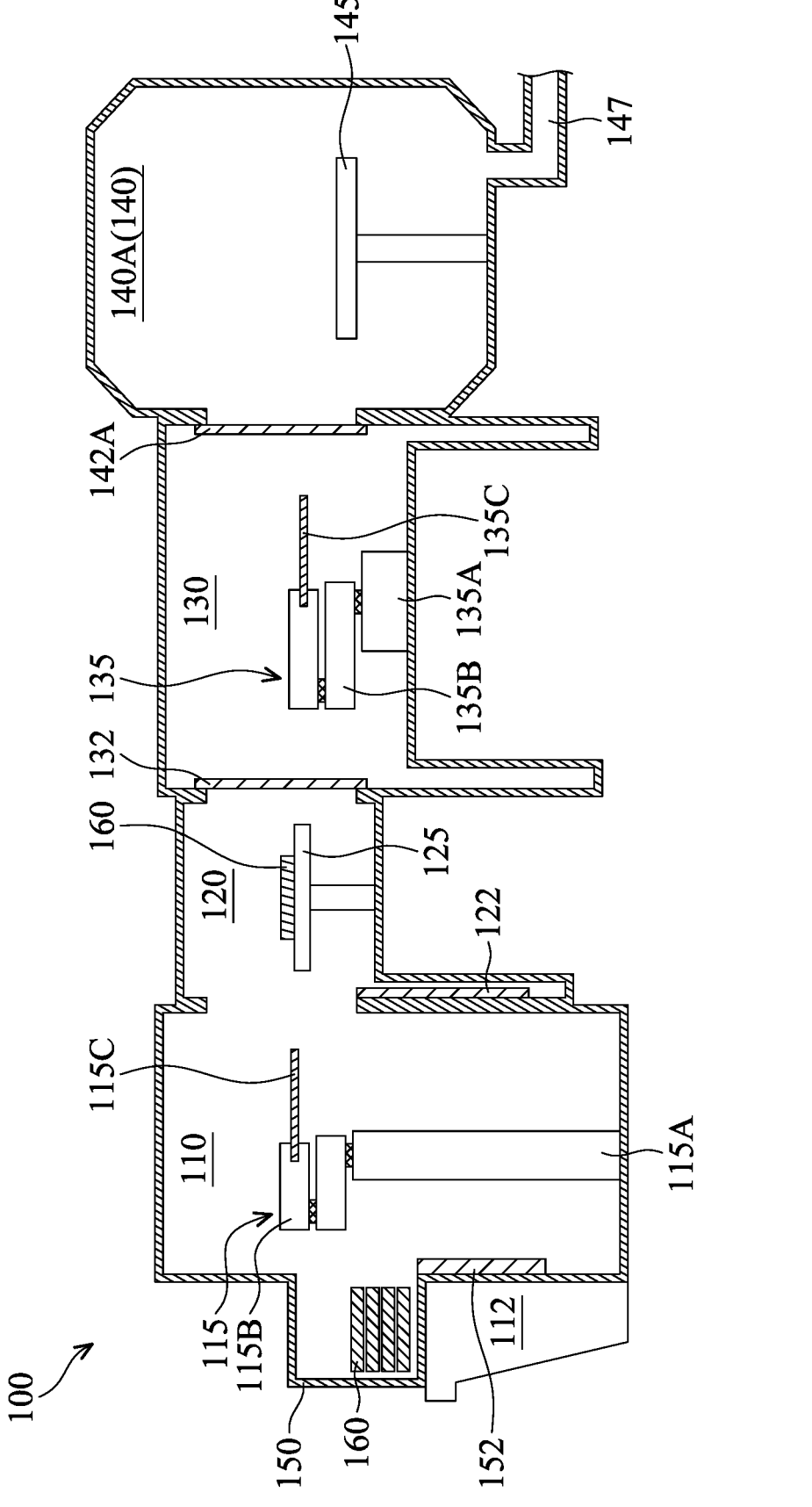

Reference is made to FIGS. 1, 3A and 5. The method 1000 proceeds to operation 1004 by transferring the workpiece into a load lock chamber. In FIG. 5, the workpiece 160 is transferred from the EFEM 110 to the load lock chamber 120 by the load lock transfer robot arm 115. While the workpiece 160 is about to be transferred, the load lock door 122 is opened, and the load lock transfer robot arm 115 moves the workpiece 160 into the load lock chamber 120 and places the workpiece 160 on a supporter 125. Once the workpiece 160 is placed on the supporter 125 of the load lock chamber 120, the load lock transfer robot arm 115 releases the workpiece 160 and moves back to the EFEM 110.

Figure 6:
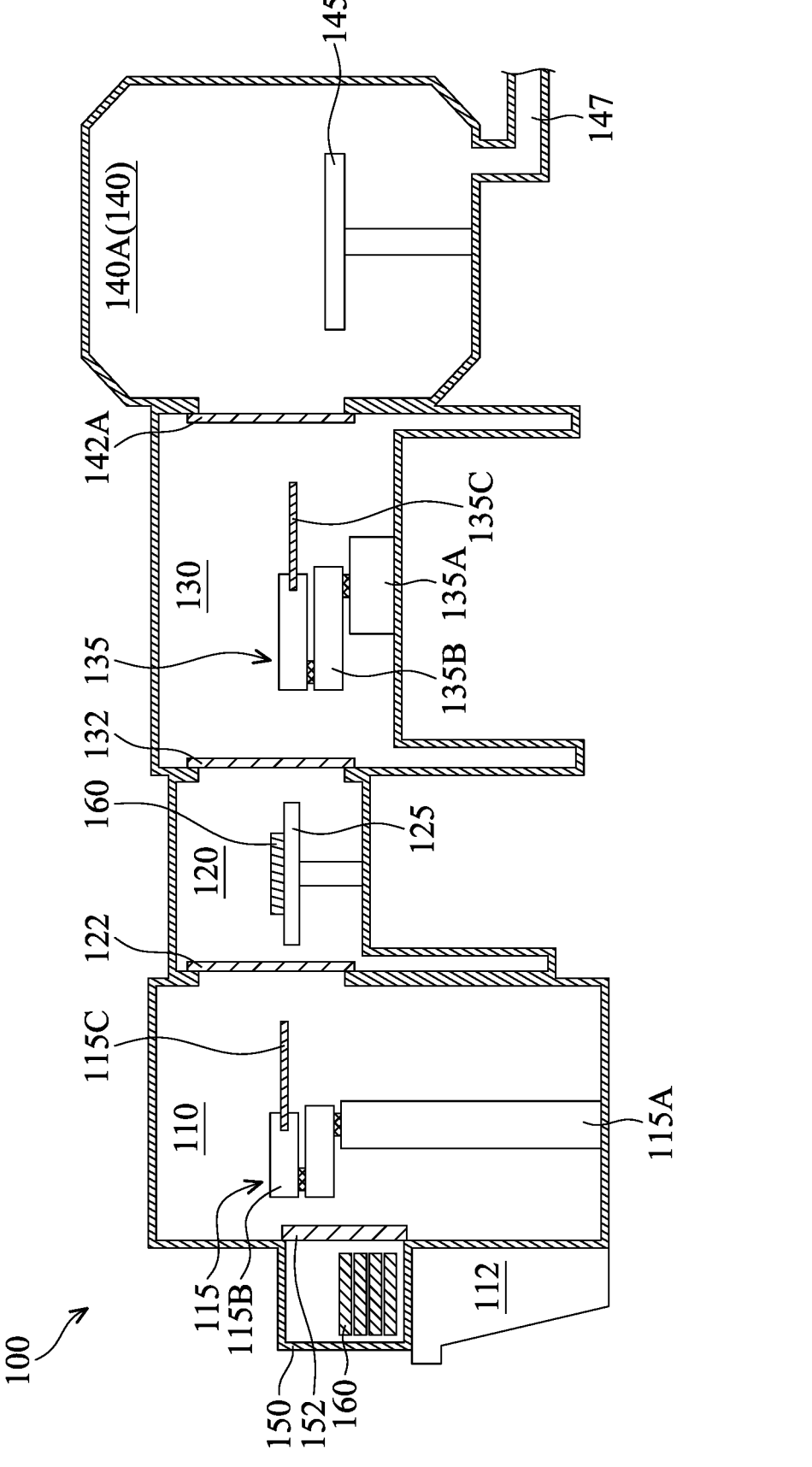

Reference is made to FIGS. 1, 3A and 6. The method 1000 proceeds to operation 1006 by closing a load lock door of the load lock chamber. In FIG. 6, the load lock door 122 is closed, so as to seal the load lock chamber 120. In the fabrication of a semiconductor device, many workpiece processes are performed in the process chambers 140A under vacuum or near-vacuum pressure. The load lock chamber 120 operates as a buffer area where pressure on the workpiece 160 is adjusted. After the workpiece 160 is transferred into the load lock chamber 120 from the EFEM 110, the load lock chamber 120 changes the atmospheric pressure to a value of pressure maintained in the central transfer chamber 130. In some embodiments, the value of pressure maintained in the central transfer chamber 130 is much lower than the atmospheric pressure or almost near vacuum as designated by some workpiece processes. The pressure in the load lock chamber 120 is adjusted via a gas pump (not shown) attached thereto. In some embodiments, an inflow of nitrogen ($N_2$) gas is generated by the gas pump, and is used to control the pressure inside the load lock chamber 120.

The load lock chamber 120 is connected to the central transfer chamber 130 via the central transfer chamber door 132. In some embodiments, during controlling the pressure inside the load lock chamber 120, the load lock door 122 and the central transfer chamber door 132 are closed to separate (i.e., gaseously isolate) the load lock chamber 120 from the EFEM 110 and the central transfer chamber 130, to seal the load lock chamber 120 and maintain the pressure therein. Stated another way, the load lock chamber 120 is gaseously isolated from the EFEM 110 and the central transfer chamber 130 during controlling the pressure inside the load lock chamber 120.

Figure 7:
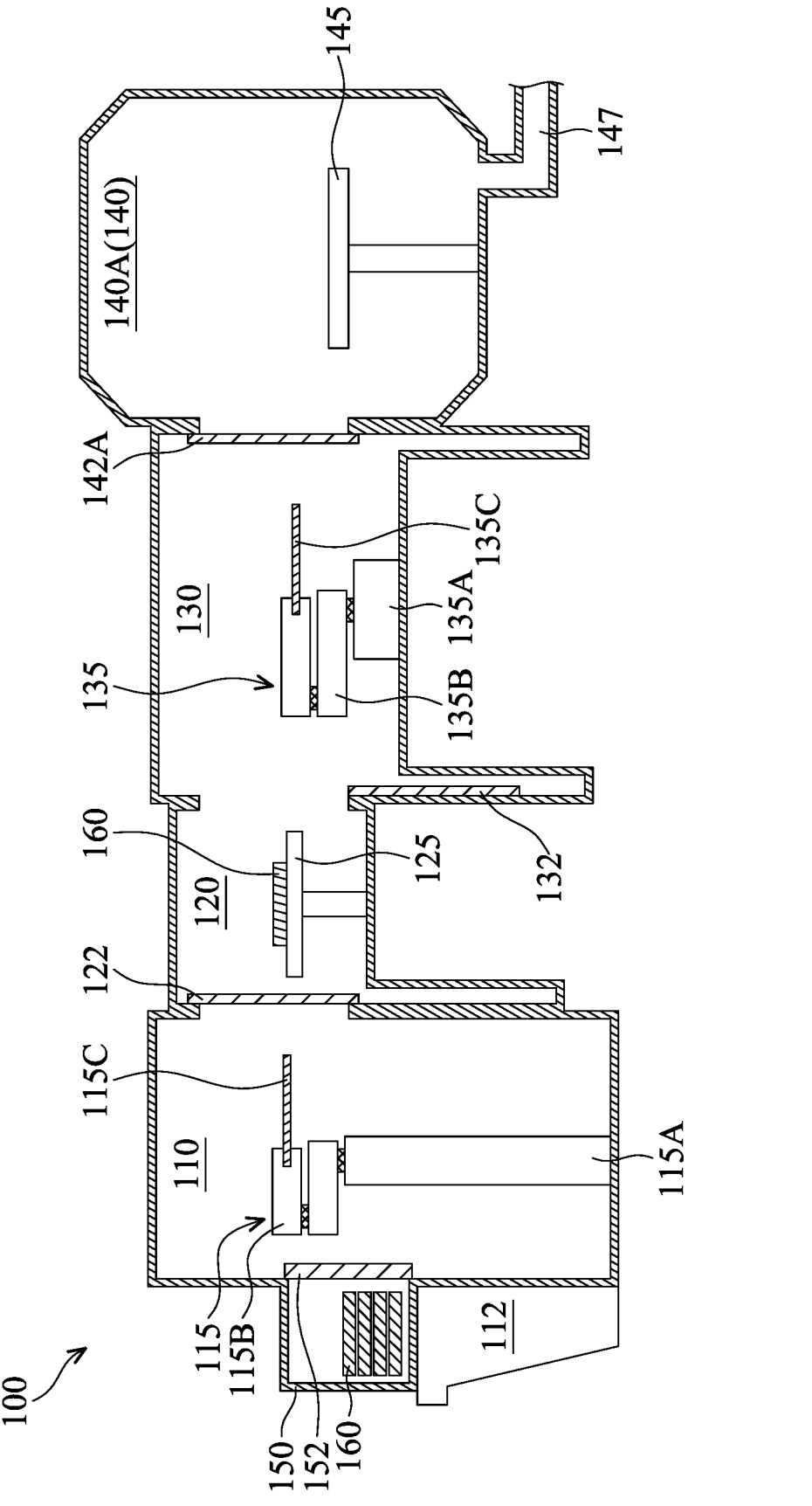

Reference is made to FIGS. 1, 3A and 7. The method 1000 proceeds to operation 1008 by opening a central transfer chamber door of the load lock chamber. In FIG. 7, the central transfer chamber door 132 is opened, and thus the load lock chamber 120 and the central transfer chamber 130 are spatially communicated to (i.e., in gaseous communication) each other. In some embodiments, opening the central transfer chamber door 132 results in a pressure and temperature equilibrium between the load lock chamber 120 and the central transfer chamber 130, through gaseous communication there between. Accordingly, the central transfer chamber door 132 is opened after the pressure in the load lock chamber 120 is adjusted to become equal to that of the central transfer chamber 130.

Figure 8:
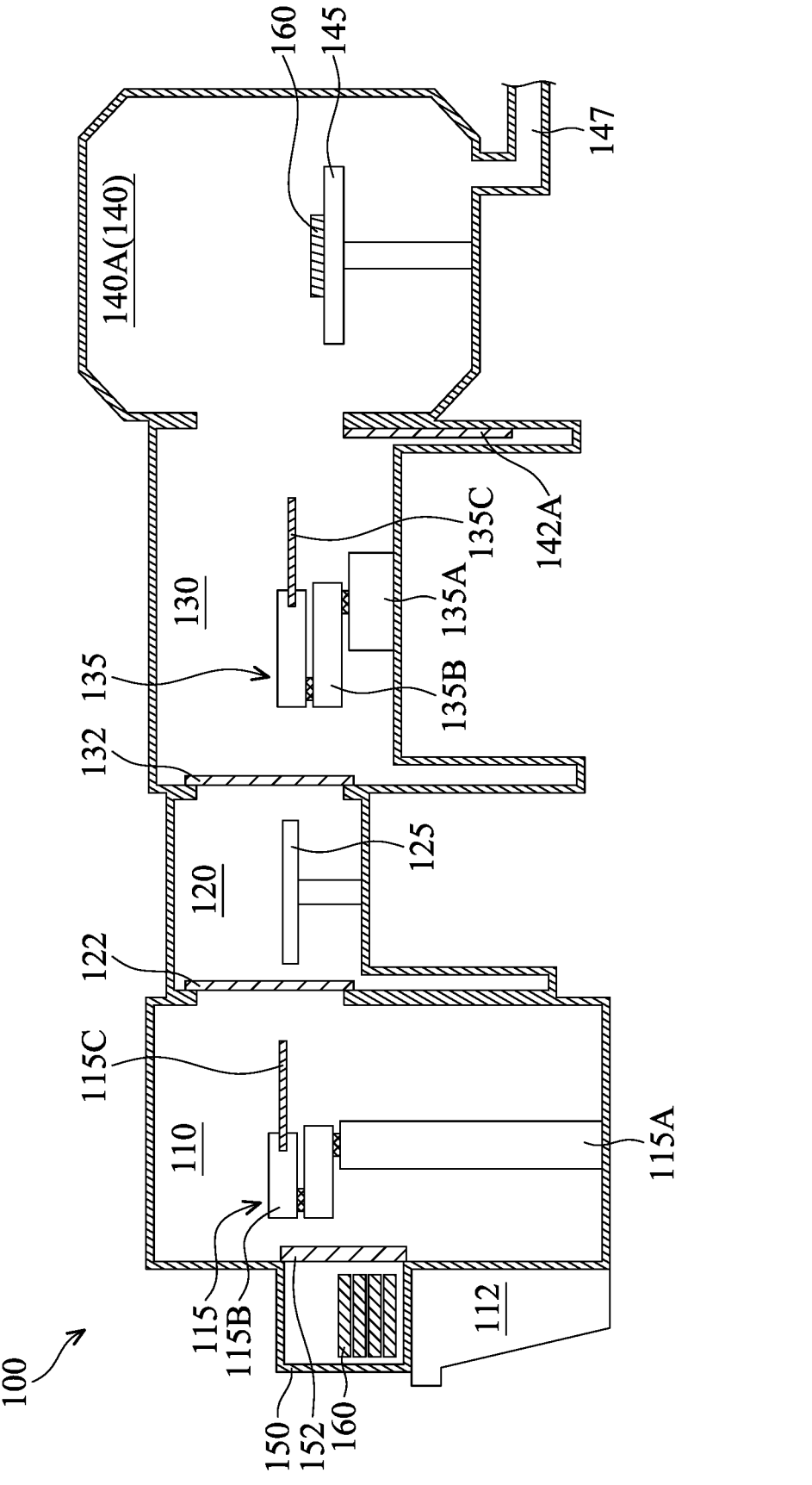

Reference is made to FIGS. 1, 3A and 8. The method 1000 proceeds to operation 1010 by transferring the workpiece into a first process chamber. In FIG. 8, the workpiece 160 is transferred from the load lock chamber 120 to the process chamber 140A by the central transfer robot arm 135 within the central transfer chamber 130. In greater detail, the central transfer robot arm 135 grasps the workpiece 160 on the supporter 125 within the load lock chamber 120 and then moves the workpiece 160 from the load lock chamber 120 into the process chamber 140. In some embodiments, the robot arm 135 places the workpiece 160 on a chuck 145 in the process chamber 140, such that the bottom surface of the workpiece 160 is in contact with the top surface of the chuck 145. As an example, the workpiece 160 is transferred into the process chambers 140A of the process chambers 140A shown in FIG. 1, and thus the process chamber 140A in FIG. 8 is also referred to as process chamber 140A. In some other embodiments, the workpiece 160 can also be moved into the process chambers 140B-D in FIG. 1.

In some embodiments, the central transfer chamber 130 plays the role of a central dock station where the workpiece 160 transferred from the load lock chamber 120 are temporarily kept in preparation for processing and distributed to the plurality of process chambers 140A by the central transfer robot arm 135. In some embodiments, the central transfer chamber 130 is held under vacuum (e.g., at a pressure of less than 10-2 mbar). That is, the gas environment inside the central transfer chamber 130 has a lower atmosphere pressure than the gas environment outside the central transfer chamber 130 (or the system 100). In some embodiments, at an entrance to the process chamber 140A, there is a chamber door 142A.

In some embodiments, the central transfer robot arm 135 includes a support 135A. An armset 135B is mounted on the support 135A. In some other embodiments, the armset 135B may include suitable number of arms, such as two or more. The arms of the armset 135B are rotatably connected to each other. At the far end of the armset 135B, an end effector 135C is rotatably connected to an end of the armset 135B. The load lock transfer robot arm 135 can position the end effector 135C in a desired position within a circle around the support 135A, having a radius that is substantially associated with the length of the armset 135B. As is apparent, also other kinds of robots may be used. The end effector 135C is arranged to grasp an object, such as the workpiece 160. For example, the end effector 135C grasps the workpiece 160 in the load lock chamber 120 and then moves the workpiece 160 into the process chamber 140A.

Figure 9:
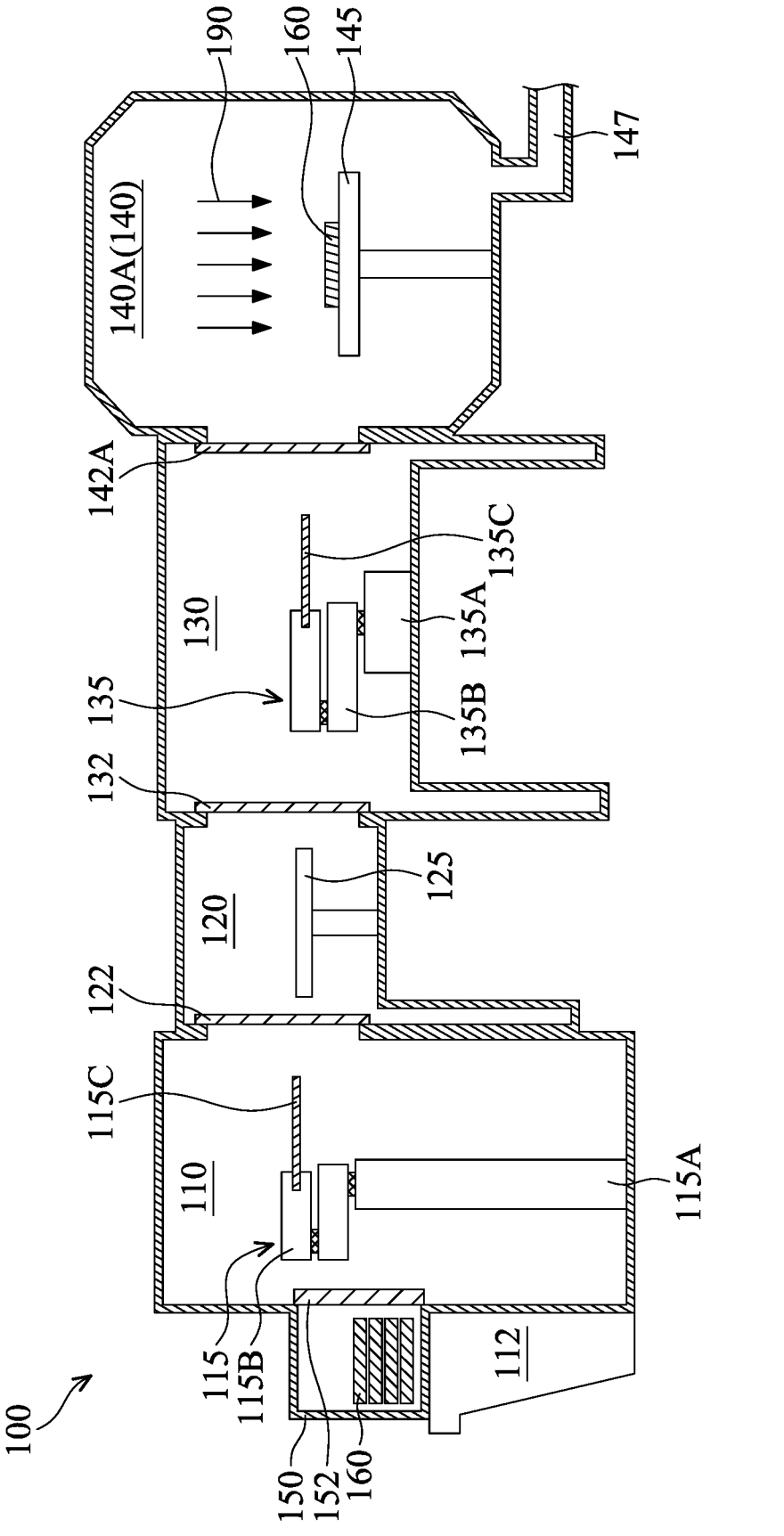

Reference is made to FIGS. 1, 3A and 9. The method 1000 proceeds to operation 1012 by performing a first process to the workpiece in the first process chamber. In FIG. 9, once the workpiece 160 is transferred into the process chamber 140A, the chamber door 142A is closed. Then, a process 190 is performed to the workpiece 160. In some embodiments, the process chamber 140A may be configured to perform suitable manufacturing process on the workpiece 160. The process 190 include deposition processes such as physical vapor deposition ("PVD"), chemical vapor deposition ("CVD"), plasma-enhanced chemical vapor deposition ("PECVD"), electrochemical deposition ("ECD"), molecular beam epitaxy ("MBE"), atomic layer deposition ("ALD") and/or other deposition processes; etching processes including wet and dry etching and ion beam milling; lithographic exposure; ion implantation; thermal processes such as annealing and/or thermal oxidation; cleaning processes such as rinsing and/or plasma ashing; chemical mechanical polishing or chemical mechanical planarizing (collectively "CMP") processes; testing; any procedure involved in the processing of the workpiece 160; and/or any combination of procedures.

Figure 10A:
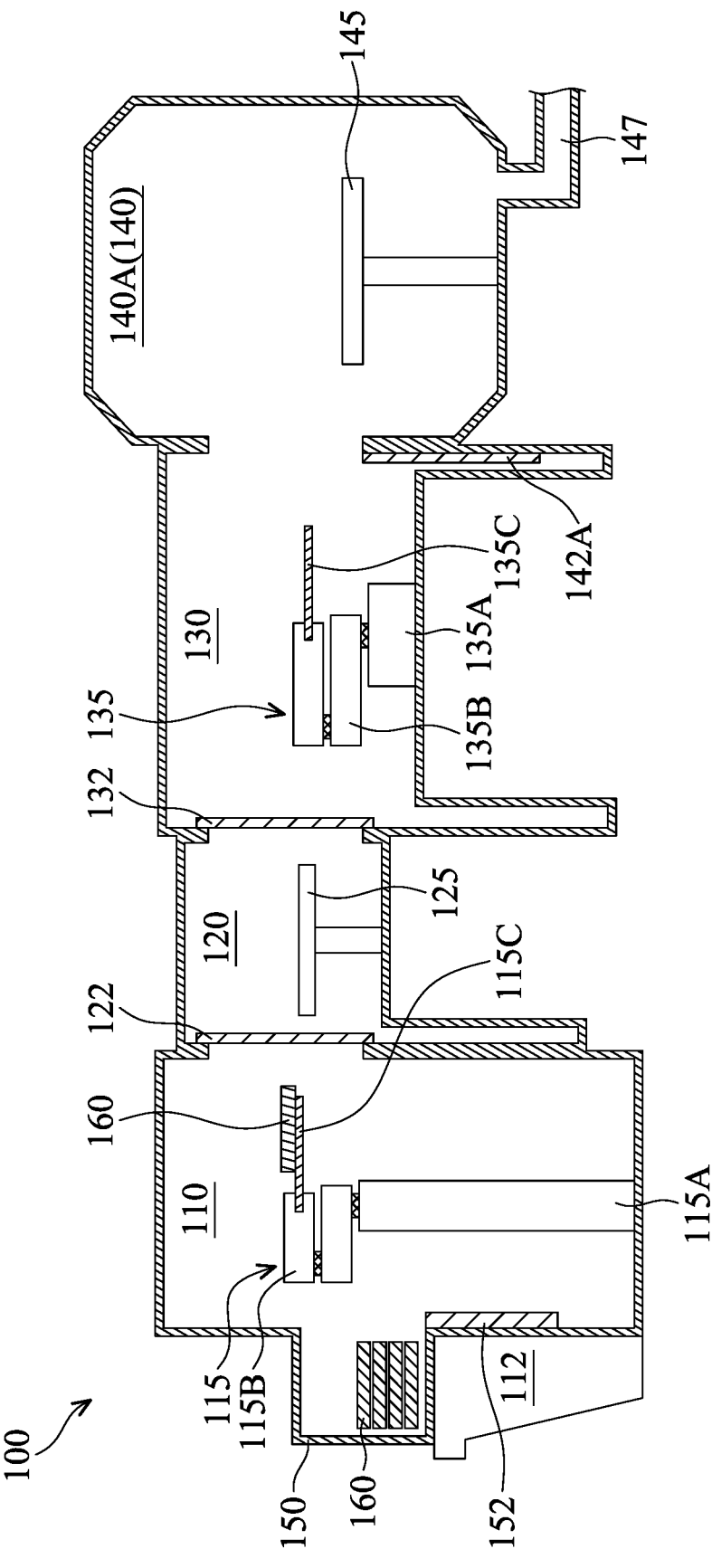
Figure 10B:
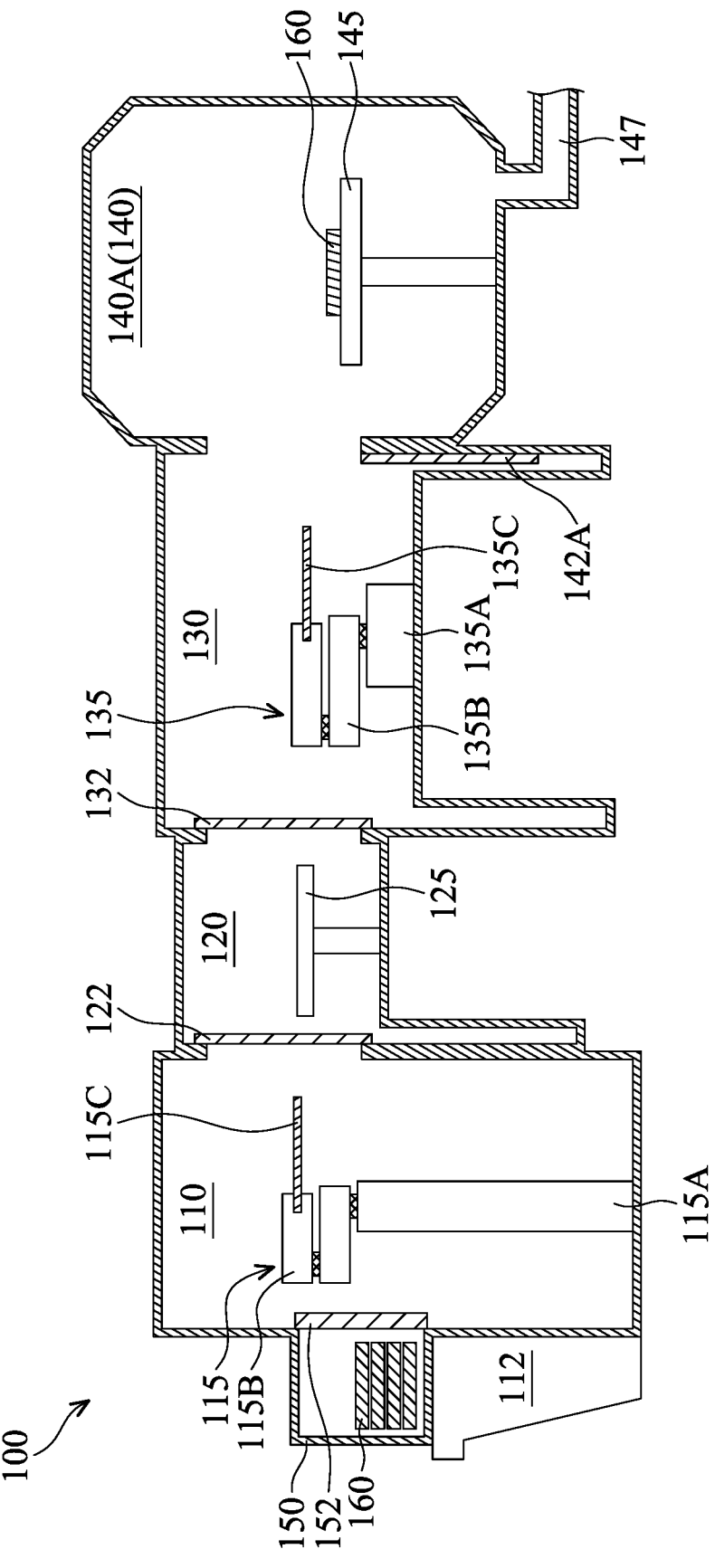

Reference is made to FIGS. 1, 3A, 10A and 10B. The method 1000 proceeds to operation 1014 by transferring the workpiece from the first process chamber to a second process chamber. FIGS. 10A and 10B are cross-sectional view of process chamber 140A and 104B, respectively. In FIG. 10A, the workpiece 160 is moved away from the process chamber 140A, and thus the process chamber 140A is empty. That is, the first process chamber 140A is free of the workpiece 160 after the workpiece 160 is moved away. On the other hand, as shown in FIG. 10B, the workpiece 160 is transferred to the process chamber 140B and is placed on the chuck 145 in the process chamber 140B. In greater detail, after the process performed in the process chamber 140A is finished, the chamber door 142A of the process chamber 140A is opened, and the central transfer robot arm 135 within the central transfer chamber 130 moves into the process chamber 140A to grasp the workpiece 160. Then, another chamber door 142B of the process chamber 140B is opened, and the central transfer robot arm 135 then moves the workpiece 160 from the process chamber 140A to the second process chamber 140B and places the workpiece 160 on the chuck 145 in the process chamber 140B. The workpiece 160 is transferred from the process chamber 140A (FIG. 10A) to the process chamber (FIG. 10B) by the central transfer robot arm 135 within the central transfer chamber 130 to perform another process to the workpiece 160. In some embodiments, the second process chamber 140B may be similar to or different from the process chamber 140A. For example, the process chambers 140A and 140B may be used to perform the same or different processes.

Embodiments in accordance with the present disclosure are described with reference to an EFEM as an example of a workpiece handling module. An EFEM 110 is a device that can be part of an AMHS (Automated Material Handling System), that typically houses a robotic wafer handling system (not shown), and that includes one or more FOUP (Front Opening Unified Pod) docks (not shown). Each FOUP dock is configured in accordance with the FIMS (Front-opening Interface Mechanical Standard), to receive a FOUP and access the contents while protecting the contents from contaminants. The EFEM 110 is configured as an interface for one or more processing tools, to access a FOUP and move wafers between the FOUP and the processing tool(s). Typically, the EFEM 110 is configured to be coupled to a processing tool on the side opposite the FOUP docks, e.g., via the load lock chamber 120 and the central transfer chamber 130.

In some systems, during the processes employed in manufacturing semiconductor devices, the semiconductor-material wafers are maintained in a non-reactive atmosphere, such as an inert gas or a gas selected to be non-reactive with materials commonly used in the processing of semiconductor wafers. In such systems, the gas is typically recirculated. Other systems use ambient air, which is or is not recirculated. Whether a system uses air or another gas, the atmosphere of the system must be continually purified, to remove dust and other particulate contamination, as well as gaseous contaminants that are products of many of the manufacturing processes. As used in the claims, unless explicitly defined otherwise, the term gas is not limited to any particular gas, but includes gases selected for specific properties, such as reactivity or non-reactivity, etc.; ambient air; purified or otherwise modified air; vapors; etc.

Features of the EFEM 110 are described below with reference to FIGS. 1 and 11, according to various embodiments, but the drawings are diagrammatic, and depict some details of such devices schematically. Features and elements have been omitted for clarity, where such features are known in the art and are not required for an understanding of the principles described.

Figure 11A:
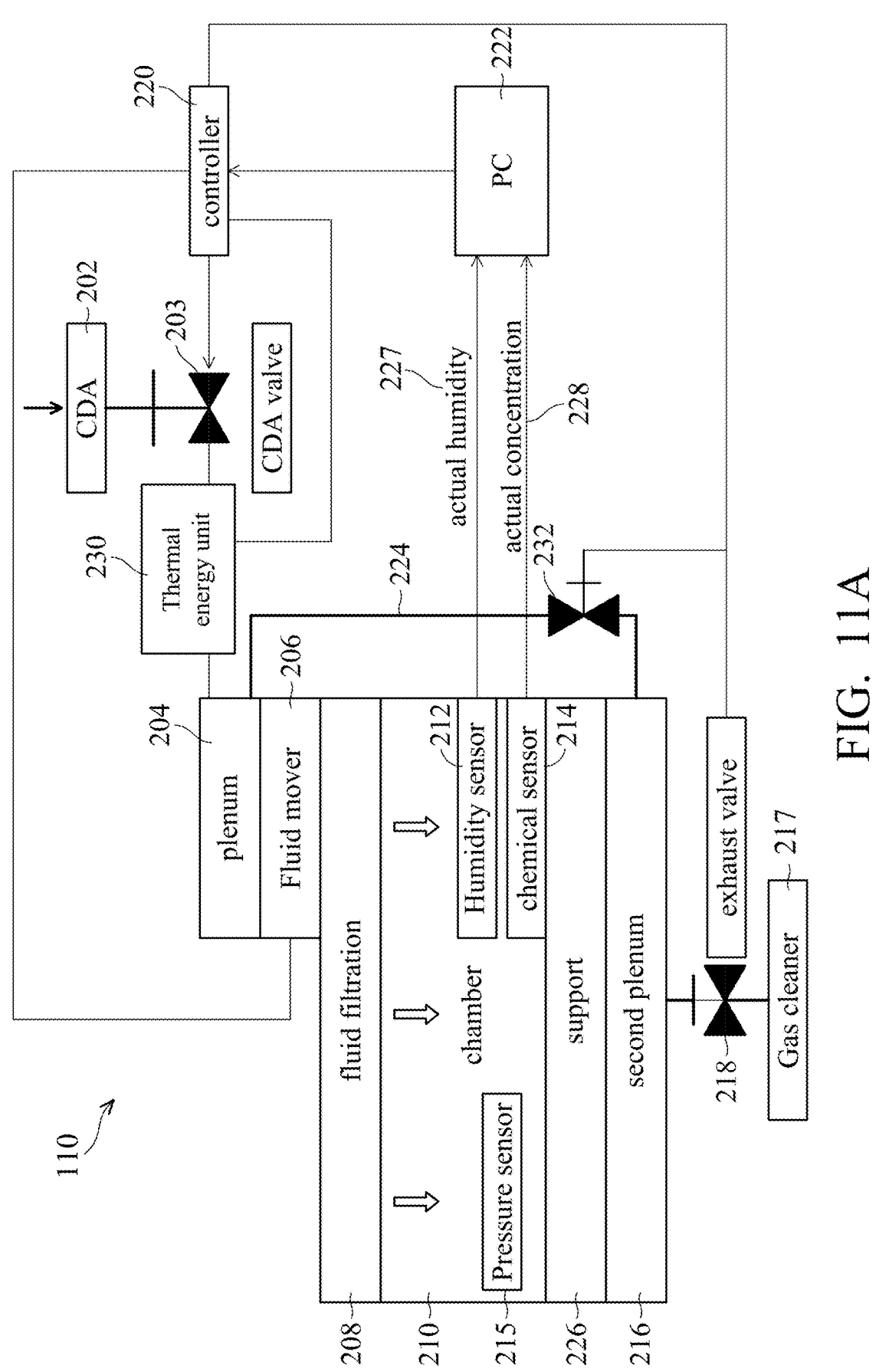
FIG. 11A is a schematic side view of a system for controlling or adjusting environmental conditions in a workpiece handling module in accordance with embodiments of the present disclosure.

Referring to FIGS. 1 and 11, an example of a workpiece handling module, e.g., EFEM 110, in accordance embodiments of the present disclosure is illustrated and described. FIG. 1 is a top plan view of a system 100 that includes a workpiece handling module, e.g., an EFEM 110. FIG. 11 is a side view of an embodiment of a workpiece handling module, e.g., an EFEM 110, in accordance with embodiments of the present disclosure. In accordance with some embodiments of the present disclosure, EFEM 110 includes a source of air 202 (e.g., clean dry air), a thermal energy unit 230 for introducing to or removing thermal energy from air originating from the source of air 202, a valve 203 in fluid communication with the source of air 202, a plenum 204 in fluid communication with the source of air 202, a fluid moving device 206 in fluid communication with the plenum 204, a fluid filtration unit 208 in fluid communication with the fluid moving device 206, a chamber 210 in fluid communication with the fluid filtration unit 208, the chamber including a humidity sensor 212, a gas sensor 214 and a pressure sensor 215, a second plenum 216 in fluid communication with the chamber 210, an exhaust valve 218 in fluid communication with the second plenum 216, and a controller 220 in communication, e.g., data or electrical communication, with the humidity sensor 212, the gas sensor 214, the exhaust valve 218, the fluid moving device 206 and the valves 203 and 218. In the embodiment illustrated in FIG. 11, the controller 220 is communicatively connected to a computer 222. Data communication can be a wired connection or a wireless connection. In the embodiment illustrated in FIG. 11, the EFEM 110 includes a support or floor 226 through which fluid can pass from chamber 210 into second plenum 216. In the embodiment illustrated in FIG. 11, the plenum 204 and fluid mover 206 are illustrated as two separate components. In other embodiments that fluid mover 206 can include an integral plenum for receiving air from the source of air 202 and from recycle line 224.

In the embodiment illustrated in FIG. 11, the EFEM 110 includes a chamber 210 configured to receive workpieces from, e.g., a FOUP or from the load lock chamber 120. Though not illustrated, the chamber can include workpiece moving devices such as a robotic arm. One side of the chamber 210, e.g., in inlet side of chamber 210 is in fluid communication with an outlet of a fluid filtration unit operation 208, e.g., a gas filtration device configured to remove unwanted particulates and other contaminants from gas destined to enter chamber 210. Gas filtration devices are well known, accordingly details thereof are not provided herein. The inlet of the fluid filtration device 208 receives gas from the outlet of a fluid mover 206, e.g., a fan or other device configured to move a gas. When fluid mover 206 is a fan, it is powered by a motor and includes a plurality of blades to drive the air. In some embodiments, the speed of the motor can be adjusted to adjust the flow rate generated by the fan. In some embodiments the angle of the plurality of the blades is adjustable. Adjust of the angle of the blades results in an adjustment in the flow rate of air generated by the fan. An inlet of the fluid mover 206 is in fluid communication with an outlet of a plenum 204. As explained below in more detail, the amount of gas moved by fluid mover 206 can be adjusted by adjusting the operation of the fluid mover, e.g., by adjusting the speed of the fluid mover or embodiments where the fluid mover is a fan, by adjusting the angle of the blades of the fan or by adjusting the size of the openings between the fluid mover and the plenum or the fluid filtration unit.

Plenum 204 is a chamber or volume designed to contain a gas. An inlet of plenum 204 is in fluid communication with a source of gas 202, e.g., clean dry air or other gas. Flow of gas from gas source 202 to plenum 204 is controlled by an adjustable gas valve 203 located between the inlet of plenum 204 and the source of gas 202. In some embodiments, a thermal energy unit 230 is positioned between plenum 204 and valve 203. Thermal energy unit is configured to introduce thermal energy into the air (i.e., heat the air) or remove thermal energy from the air (i.e., cool the air). As explained below in more detail, the amount of gas passing from gas source 202 to plenum 204 can be adjusted by adjusting the adjustable gas valve 203.

Gas that has entered chamber 210 flows through an outlet of the chamber 210 to an inlet of a second plenum 216. In the illustrated embodiment, second plenum 216 is separated from chamber 210 by a support 226. In some embodiments, support 226 can be the floor of the chamber 210. Support 226 is configured such that the gas may pass through support 226 from chamber 210 into second plenum 216. Gas in second plenum 216 can be returned to the plenum 204 via recycle line 224. In the embodiment illustrated in FIG. 11, recycle line 224 includes a valve 232 which is in communication with computer 222 or controller 220 such that computer 222 or controller 220 can adjust the amount of air from second plenum 216 that is recycled back to plenum 204. Adjusting the amount of air recycled from second plenum 216 to plenum 204 can be used to supplement adjustment in the humidity or gas concentration in chamber 210 as described below in detail. Alternatively or in conjunction with return of gas to first plenum 204 via the recycle line 224, a portion of gas in second plenum 216 can be exhausted from the EFEM 110 through exhaust valve 218. Gas that passes through exhaust valve 218 can be delivered to a gas cleaner 217, e.g. a gas scrubber, where contaminants are removed. As explained below in more detail, the amount of gas passing from second plenum 216 to gas cleaner 217 can be adjusted by adjusting opening or closing of the exhaust valve 218.

In the embodiment illustrated in FIG. 11, chamber 210 includes a humidity sensor 212 in the chemical sensor 214. Humidity sensor 212 is configured to sense the humidity within chamber 210 and generate a signal 227 representative of the actual humidity within chamber 210. Suitable humidity sensors are well known and accordingly a detailed description thereof is not provided herein. Chemical sensor 214 is configured to sense the concentration of different chemicals within the chamber 210. For example, chemical sensor 214 is configured to sense the concentration of gaseous chemicals that are harmful to humans or harmful to processes or tools that such gaseous chemicals may infiltrate. Examples of such gases include $CO$, $SO_2$, $NO_2$, $SiH_4$ (silane) and saline gas. Embodiments of the present disclosure are not limited to chemical sensors capable of sensing gases harmful to humans or harmful to processes or tools that such gaseous chemicals may infiltrate. Embodiments of the present disclosure include chemical sensor capable of sensing gases that are not harmful to humans or harmful to processes or tools that such gaseous chemicals may infiltrate. As described below in more detail, the signals representing the actual humidity and actual concentration of gaseous chemicals are received by a computer 222 which processes the signals and generates signals for sending to controller 220. Chamber 210 also includes a pressure sensor 215 configured to sense pressure within chamber 210 and generate a signal representative of the actual pressure within chamber 210. Pressure sensor 215 is also communicatively coupled to computer 222 so that the signal representative of the actual pressure within chamber 210 can be delivered to computer 222. In the embodiment illustrated in FIG. 11, the computer 222 is represented as being independent of controller 220. In other embodiments, controller 220 can include a processor/computer or computer 222 can include a controller for controlling valve 203, valve 218, and fluid mover 206.

Reference is made to FIG. 3B (in concert with FIGS. 1 and 11) which illustrates a method 2000 for controlling an environment within a workpiece handling module, e.g., a semiconductor workpiece processing chamber, central transfer chamber, a load lock chamber or an equipment front end module in accordance with embodiments of the present disclosure. Typically, in a semiconductor workpiece processing chamber, materials are added to or removed from a semiconductor workpiece. This is in contrast to operations carried out in a central transfer chamber, a load lock chamber or an equipment front end module where materials are not typically added to or removed from a semiconductor workpiece, but instead, semiconductor workpieces are transported between different chambers or containers.

The method 2000 starts with operation 2002 during which a workpiece is received in a semiconductor workpiece handling module, e.g., an equipment front end module 115. It should be understood that in other embodiments, methods in accordance with the present disclosure can be initiated and carried out without a workpiece within the semiconductor workpiece handling module 110. Method 2000 proceeds with operation 2004 which involves delivering a gas, e.g., air to plenum 204. The air can be as clean dry air (CDA) or some other gas. At operation 2006, fluid moving device 206 causes gas within plenum 204 to be delivered to the fluid filtration unit 208. The gas which is filtered in fluid filtration unit 208 is flowed into chamber 210 at operation 2008. At operation 2010, humidity within chamber 210 is sensed by humidity sensor 212. Humidity sensor 212 generates a signal 227 representative of the actual humidity within chamber 210 which is received by computer 222. Operation 2010 optionally includes a step of sensing concentration of a gas within chamber 210 utilizing chemical sensor 214. Chemical sensor 214 generates a signal 228 representing the actual concentration of a gas within chamber 210. Signal 228 is received by computer 222. At operation 212, air and gas within chamber 210 flow to a second plenum 216. At operation 2014, a flow rate of air into plenum 204 is adjusted based on the actual humidity in chamber 210 and a desired humidity for chamber 210. In some embodiments, the flow rate of air into plenum 204 is adjusted based on the actual gas concentration in chamber 210 and the desired gas concentration for chamber 210. At optional operation 2016, the amount of air and gas exhausted from plenum 204 is adjusted based on the actual humidity in chamber 210 and desired humidity in chamber 210 and/or the actual concentration of gas in chamber 210 and desired concentration of gas in chamber 210. According to embodiments of the present disclosure the desired concentration of the gas is a concentration of a gas that is below a concentration set industry regulators as being a maximum concentration to which humans should be exposed. In other embodiments, the desired concentration of the gas is a concentration of a gas that is below a concentration that would negatively affect equipment contained in environments into which the gas is exhausted or processes carried out in those environments. When the chamber is a chamber that receives workpieces from a processing tool, in accordance with embodiments of the present disclosure the desired humidity is in the range of 30 to 70% of the humidity in the processing tool from which the semiconductor workpiece is transferred. In other embodiments, the desired humidity is in the range of 40-60% of the humidity in the processing tool from which the semiconductor workpiece is transferred. Examples of chambers that receive workpieces from processing tools include central transfer chambers, load lock chambers, chambers housing load lock robots and equipment front end modules. When the chamber is a chamber in which a semiconductor process is carried out, the desired humidity is in the range of about 30 to 50%. Embodiments in accordance with the present disclosure are not limited to desired humidity within the foregoing ranges. For example, the desired humidity may be higher than the lower end of these ranges or lower than the higher end of these ranges. Desired humidity is chosen so that the humidity within the chamber does not adversely affect the process being carried out in the chamber.

With reference to FIG. 3C, a method 3000 in accordance with disclosed embodiments starts with operation 3002 where signal 227 indicative of actual humidity in chamber 210 is received. In some embodiments, operation 3002 includes receiving signal 228 indicative of a gas concentration in chamber 210. In some embodiments, operation 3002 includes receiving both the signal 227 indicative of actual humidity in chamber 210 and receiving the signal 228 indicative of actual gas concentration in chamber 210. In the embodiment illustrated in FIG. 11, these signals are received by computer 222, but in other embodiments, these signals are received by controller 220. Method 3000 proceeds with operation 3004 which may be carried out by computer 222 or controller 220. Operation 3004 includes comparing actual humidity represented by signal 227 with a desired humidity stored in memory of the computer 222 or controller 220. The result of the comparisons described above is used in operation 3006 of method 3000 to determine a volume or flow rate of air to deliver to chamber 210 to produce the desired humidity in the chamber 210. In other embodiments, the result of the comparison is used in operation 3006 of method 3000 to determine a volume of air and the gas to exhaust from the second plenum 216 to produce the desired humidity in chamber 210. Method 3000 proceeds with operation 3008 which includes adjusting the flow of air into chamber 210 and/or adjusting the flow of gas and air out of chamber 210 through exhaust valve 218 in order to achieve the desired humidity in chamber 210. Method 3000 illustrated in FIG. 3C then optionally proceeds with operation 3010 where the signal 228 representing actual gas concentration in chamber 210 is compared with a desired gas concentration stored in memory of computer 222 or controller 220. The result of this comparison can be used in operation 3012 of method 3000 to determine a volume of air to deliver to chamber 210 to produce the desired gas concentration in the chamber 210. In other embodiments, the result of this comparison can be used in operation 3012 of method 3000 to determine a volume of air and the gas to exhaust from the second plenum 216 to produce the desired gas concentration in chamber 210. Method 3000 proceeds with operation 3014 which includes adjusting the flow of air into chamber 210 and/or adjusting the flow of gas and air out of chamber 210 through exhaust valve 218 in order to achieve the desired gas concentration in chamber 210. While the method 3000 is described above with separate steps 3004 and 3010 of comparing actual humidity with desired humidity and comparing actual gas concentration with a desired gas concentration, in some embodiments, these steps can be carried out in parallel at the same time. Similarly, steps 3006, 3008, 3012 and 3014 can be carried out in parallel and at the same time or they can be carried out in the order of 3012, 3014, 3006 and 3008.

When the result of step 3004 indicates the actual humidity in chamber 210 is greater than the desired humidity steps are taken to increase the amount of air, e.g., CDA delivered to chamber 210. Delivering more CDA to chamber 210 will reduce the humidity within chamber 210. The amount of air delivered to chamber 210 can be increased by increasing the speed of fluid moving device 206 or adjusting the blade angle of fluid moving device 210 so that the flow rate of the air driven by the fluid moving device is increased. In some embodiments, the temperature of the air entering chamber 210 can be increased by introducing thermal energy from thermal energy unit 230 into air entering plenum 204. Increasing the temperature of the air entering chamber 210 can also reduce the humidity in chamber 210. In some embodiments, reducing the humidity in chamber 210 by introducing more CDA to chamber 210 or increasing the temperature of the CDA entering chamber 210 can be supplemented by increasing the amount of air and gas that is exhausted from chamber, especially when the air and gas exhausted from chamber 210 has a humidity that is higher than the humidity of the CDA being added to chamber 210.

When the result of step 3004 indicates the actual humidity in chamber 210 is less than the desired humidity steps are taken to decrease the amount of air, e.g., CDA delivered to chamber 210. Delivering less CDA to chamber 210 will increase the humidity within chamber 210. The amount of air delivered to chamber 210 can be decreased by decreasing the speed of fluid moving device 206 or adjusting the blade angle of fluid moving device 210 so that the flow rate of the air driven by the fluid moving device is decreased. In some embodiments, the temperature of the air entering chamber 210 can be decreased by removing thermal energy from the air in thermal energy unit 230. Decreasing the temperature of the air entering chamber 210 can also increase the humidity in chamber 210 by introducing air into chamber 210 that has a humidity greater than the actual humidity in chamber 210. In some embodiments, increasing the humidity in chamber 210 by introducing more CDA of lesser humidity to chamber 210 or decreasing the temperature of the CDA entering chamber 210 can be supplemented by decreasing the amount of air and gas that is exhausted from chamber, especially when the air and gas exhausted from chamber 210 has a humidity that is lower than the humidity of the CDA being added to chamber 210.

When the result of operation 3010 indicates the gas concentration in chamber 210 is greater than the desired gas concentration steps are taken to decrease the gas concentration in chamber 210. Gas concentration in chamber 210 can be reduced by delivering more air, e.g., CDA to chamber 210. The amount of air delivered to chamber 210 can be increased by increasing the speed of fluid moving device 206 or adjusting the blade angle of fluid moving device 210 so that the flow rate of the air driven by the fluid moving device is increased. In some embodiments, reducing the concentration of gas in chamber 210 by introducing more CDA to chamber be supplemented by increasing the amount of air and gas that is exhausted from chamber 210. In some embodiments, reducing the concentration of gas in chamber 210 can be implemented by increasing the amount of air and gas it is exhausted from chamber 210.

Figure 11B:
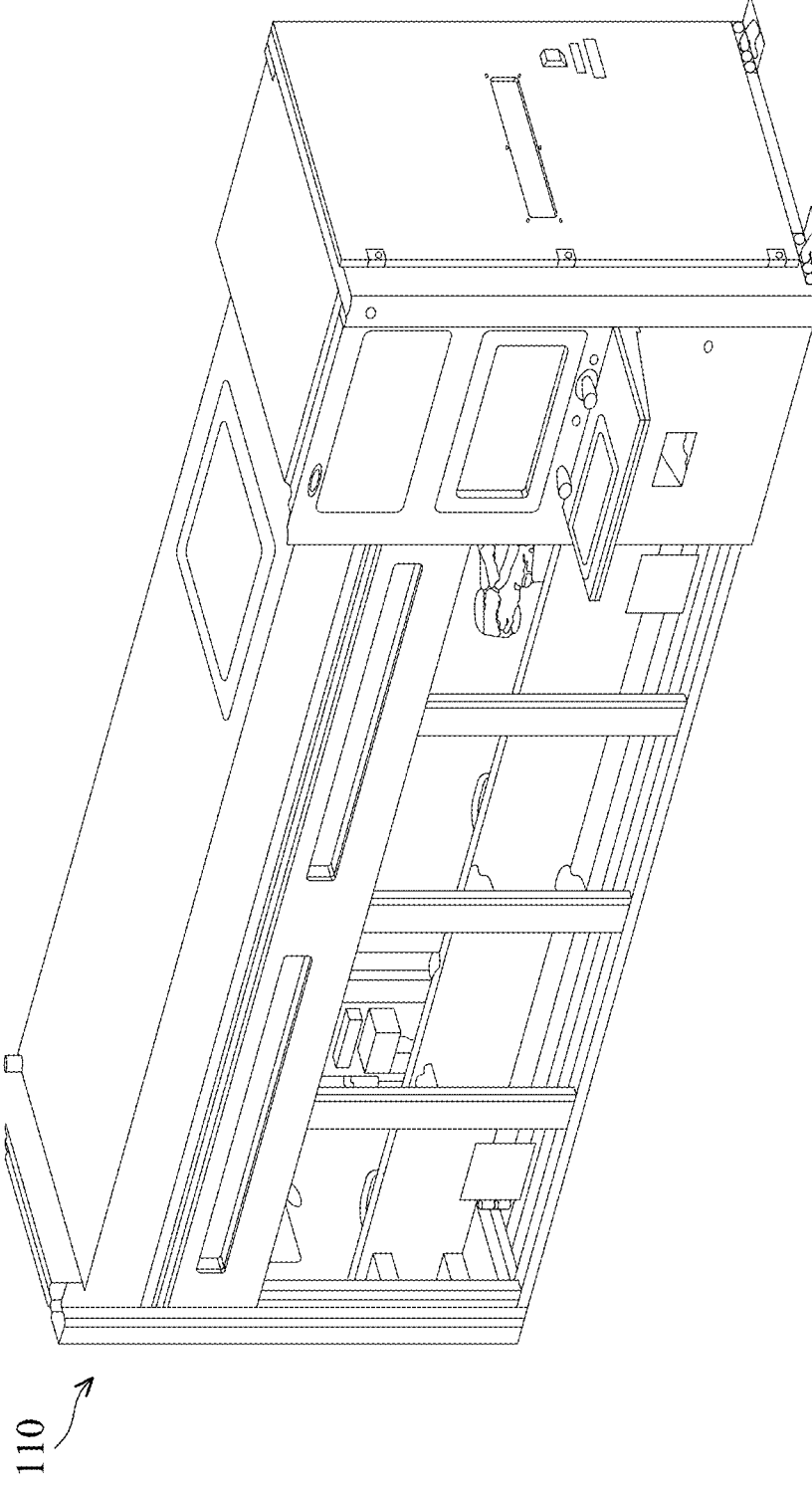
FIG. 11B is a perspective view of workpiece handling module or tool in which embodiments in accordance with the present disclosure can be implemented.

When the result of operation 3010 indicates the gas concentration in chamber 210 is less than the desired gas concentration steps are taken to increase the gas concentration in chamber 210. Gas concentration in chamber 210 can be increased by reducing the amount of air delivered to chamber 210, e.g., CDA to chamber 210. The amount of air delivered to chamber 210 can be decreased by decreasing the speed of fluid moving device 206 or adjusting the blade angle of fluid moving device 210 so that the flow rate of the air driven by the fluid moving device is decreased. In some embodiments, increasing the concentration of gas in chamber 210 by introducing less CDA to chamber be supplemented by increasing or decreasing the amount of air and gas that is exhausted from chamber 210. FIG. 11B illustrates an example of a workpiece handling module 110 that includes a first plenum 204 (not shown in FIG. 11B) and a second plenum 216 (not shown in FIG. 11B) in accordance with embodiments described herein.

Figures 12A, 12B, 12C, 12D, 12E, 12F:
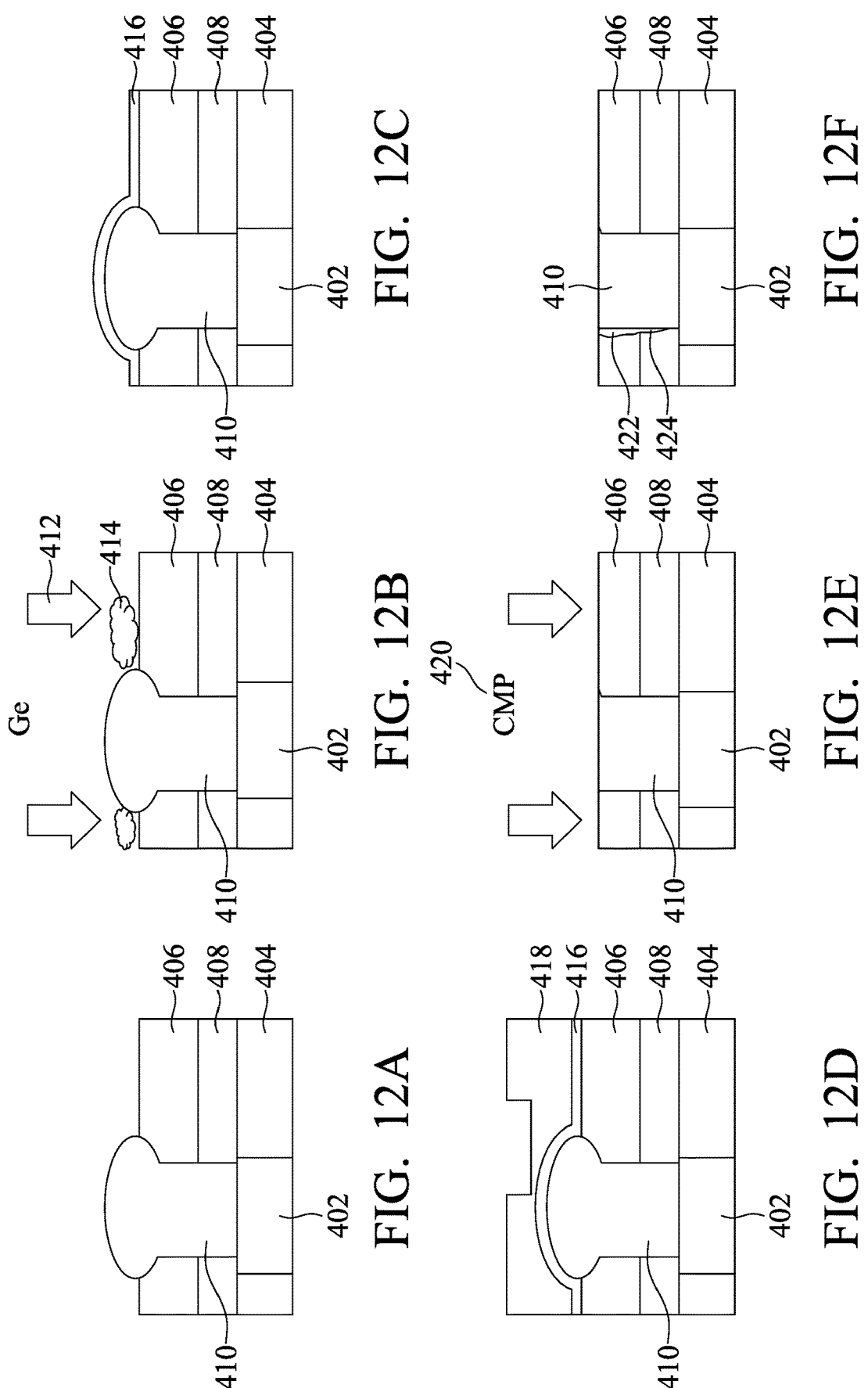
FIG. 12A-12F illustrates a semiconductor structure in various stages of manufacturing process illustrating how excess humidity can negatively affect the manufacturing process.

FIG. 12 illustrates a semiconductor device structure in various stages of manufacture and illustrates how excess humidity in a chamber or chambers in which the manufacturing process is carried out can negatively impact the produced structure. In FIG. 12a, a metal feature 402, e.g., cobalt, is within a first interlayer dielectric 404. A second interlayer dielectric 406 is separated from the first interlayer dielectric 404 and the metal feature 402 by a dielectric layer 408, e.g., silicon nitride. A conductive plug 410, e.g., of tungsten, passes through the second interlayer dielectric 406 and the dielectric layer 408 and is in electrical contact with metal feature 402. In FIG. 12b, a sealing material 412, e.g., germanium, is implanted to seal cracks between the conductive plug 410 and the interlayer dielectric 406 and the dielectric layer 408. Excess humidity 414 within the chamber in which the germanium implantation occurs results in moisture being present in the cracks and impedes the ability of the germanium implantation process to seal such cracks. Subsequent to the germanium implantation, in FIG. 12c, an adhesion layer 416, e.g., titanium or titanium nitride, is formed over the second interlayer dielectric 406. In FIG. 12d, a layer of conductive material 418, e.g., tungsten, is formed over the adhesion layer 416. In FIG. 12e, the layer of conductive material 418, adhesion layer 416 and a portion of the conductive feature 410 are removed by a planarization process, e.g., chemical mechanical planarization. FIG. 12f illustrates cracks 422 between the conductive plug 410 and second interlayer dielectric 406 and cracks 424 between the conductive plug 410 and the dielectric layer 408. It has been observed that these cracks are the result of the moisture in the chamber in which the Ge implantation occurs being excessive. The excessive moisture results in moisture occupying cracks between the second interlayer dielectric 406 and the conductive plug 410 and cracks between the dielectric layer 408 and the conductive plug 410. The presence of the moisture impedes the ability of the germanium implantation process to seal such cracks. Accordingly, the cracks are exposed during and after the CMP process illustrated in FIG. 12e. When such cracks are exposed, moisture within the chamber is able to pass through the cracks to the underlying conductive feature 402, e.g., cobalt, where it reacts with the cobalt. The reaction of the cobalt and water results in unwanted cobalt loss. Embodiments in accordance with the present disclosure for adjusting the humidity in a chamber are designed to reduce the presence of the aforementioned cracks that are not filled by germanium and thereby reduce the amount of cobalt loss.

One aspect of this description relates to systems 115 for controlling environmental conditions in a workpiece handling module. The systems include a source of air, a plenum 204 in fluid communication with the source of air and a fluid moving device 206 in fluid communication with the plenum. A chamber is present and is in fluid communication with the fluid moving device. The chamber includes a humidity sensor 212 and a gas sensor 214. The systems further include a second plenum 216 in fluid communication with the chamber and an exhaust valve 218 in fluid communication with the second plenum. A controller 220 is in communication with the humidity sensor, the gas sensor, the exhaust valve, the fluid moving device and the source of air.

Another aspect of this description relates to methods 2000/3000 of controlling environmental conditions in a semiconductor substrate handling chamber. The methods include delivering 2004 air to a plenum from a source of the air in fluid communication with the plenum. A fluid moving device is utilized to transport the air through a fluid filtration unit in fluid communication with the plenum. Air from the fluid filtration unit flows to a chamber in fluid communication with the fluid filtration unit. The humidity and concentration of a gas within the chamber is sensed. Air and gas from the chamber is flowed to a second plenum in fluid communication with the chamber. In accordance with this aspect, a flow rate of air into the plenum is adjusted based on the sensed humidity within the chamber. An amount of gas exhausted from the chamber is adjusted based on the sensed concentration of the gas within the chamber. Air and gas from the second plenum is recycled to the first plenum.

Still another aspect of this description relates to methods for processing a semiconductor workpiece. The methods include steps of forming FIG. 12a, in an ion implantation chamber, a conductive feature in an interlayer dielectric layer. Humidity 2010 in the chamber is sensed and compared to a desired humidity. Based on the results of comparing the sensed humidity to the desired humidity, the flow of clean dry air to the chamber is increased. Increasing the flow of clean dry air to the chamber reduces humidity in the chamber. Ion implantation is carried out to fill gaps between the conductive feature and the interlayer dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for controlling environmental conditions in a workpiece handling module comprising:
   a source of air configured to, in operation, provide air;
   a first plenum in fluid communication with the source of air;
   an adjustable gas valve between the first plenum and the source of air, the adjustable gas valve configured to, in operation, control a flow of the air from the source of air to the first plenum;

a thermal energy unit positioned between the first plenum and the adjustable gas valve, the thermal energy unit is configured to, in operation, introduce thermal energy into the air or remove thermal energy from the air;

a fluid moving device in fluid communication with the plenum;

a chamber in fluid communication with the fluid moving device, the chamber including a humidity sensor and a gas sensor;

a second plenum in fluid communication with the chamber;

an exhaust valve in fluid communication with the second plenum; and a controller in communication with the humidity sensor, the gas sensor, the exhaust valve, the fluid moving device and the source of air.

2. The system of claim 1, wherein the chamber further comprises a pressure sensor.

3. The system of claim 2, wherein the controller is in communication with the pressure sensor.

4. The system of claim 1, further comprising a recycle line between the second plenum and the first plenum.

5. The system of claim 1, further comprising a computer in communication with the controller.

6. The system of claim 1, wherein the chamber is located between the fluid moving device and the second plenum and includes a port for receiving processed workpieces from a workpiece processing tool.

7. The system of claim 1, wherein the chamber is a chamber where an ion implantation chamber.

8. The system of claim 1, wherein the chamber is an equipment front end module.

9. A method of controlling environmental conditions in a semiconductor substrate handling chamber, the method comprising:

opening an adjustable gas valve to introduce air from a source of air into a thermal energy unit, the thermal energy unit configured to, in operation, introduce thermal energy to the air or remove thermal energy from the air;

after passing through the thermal energy unit, delivering air to a first plenum from the source of the air in fluid communication with the first plenum;

utilizing a fluid moving device to transport the air through a fluid filtration unit in fluid communication with the first plenum;

flowing the air from the fluid filtration unit to a chamber in fluid communication with the fluid filtration unit;

sensing humidity within the chamber;

sensing concentration of a gas within the chamber;

flowing the air and the gas from the chamber to a second plenum in fluid communication with the chamber;

adjusting a flow rate of the air into the first plenum based on the sensed humidity within the chamber;

adjusting an amount of gas exhausted from the chamber based on the sensed concentration of the gas within the chamber; and recycling the air and the gas from the second plenum to the first plenum.

10. The method of claim 9, further comprising sensing a pressure within the chamber.

11. The method of claim 9, wherein the utilizing a fluid moving device to transport the air through a fluid filtration unit includes utilizing a fan.

12. The method of claim 11, wherein the adjusting a flow rate of air into the first plenum based on the sensed humidity within the chamber includes adjusting a speed of the fan and/or adjusting an angle of blades of the fan.

13. The method of claim 9, wherein the adjusting a flow rate of air into the first plenum based on the sensed humidity within the chamber includes adjusting a valve located between the source of the air and the first plenum.

14. The method of claim 9, wherein the controlling an amount of gas exhausted from the chamber based on the sensed concentration of gas within the chamber includes adjusting a valve in fluid communication with the second plenum.

15. The method of claim 9, further comprising adding material to a semiconductor workpiece or removing material from a semiconductor workpiece.

16. A method for processing a semiconductor workpiece comprising:

forming, in a chamber, a conductive feature in an inter-layer dielectric layer;

sensing humidity in the chamber, the chamber being an ion implantation chamber;

comparing the sensed humidity to a desired humidity;

increasing a flow rate of clean dry air by adjusting an adjustable gas valve to the chamber based on the results of the comparing;

reducing humidity in the chamber; and implanting ions to fill gaps between the conductive feature and the interlayer dielectric layer, and before introducing the clean dry air into the chamber, successively passing the clean dry air through the adjustable gas valve, passing the clean dry air through a thermal energy unit configured to, in operation, introduce thermal energy to the clean dry air or remove thermal energy from the clean dry air, and passing the clean dry air through a plenum.

17. The method of claim 16, further comprising:

sensing concentration of a gas within the chamber;

comparing the sensed concentration of a gas with a desired concentration of the gas; and adjusting an amount of gas and air exhausted from the chamber based on the comparing.

18. The method of claim 16, wherein increasing the flow rate of clean dry air to the chamber includes increasing the speed of a fan between a source of the clean dry air and the chamber.

19. The method of claim 16 wherein increasing the flow rate of the clean dry air to the chamber includes adjusting an angle of blades of a fan.

20. The system of claim 1, wherein the fluid plenum is between the source of air and the fluid moving device.

* * * * *